United States Patent
Kris

(10) Patent No.: US 8,472,213 B2
(45) Date of Patent: Jun. 25, 2013

(54) EXTENDING PULSE WIDTH MODULATION PHASE OFFSET

(75) Inventor: Bryan Kris, Gilbert, AZ (US)

(73) Assignee: Microchip Technology Incorporated, Chandler, AZ (US)

(*) Notice: Subject to any disclaimer, the term of this patent is extended or adjusted under 35 U.S.C. 154(b) by 71 days.

(21) Appl. No.: 13/248,571

(22) Filed: Sep. 29, 2011

(65) Prior Publication Data

US 2013/0082794 A1    Apr. 4, 2013

(51) Int. Cl.
*H02M 3/33507* (2006.01)

(52) U.S. Cl.
USPC ............... 363/21.1; 363/21.11; 327/175

(58) Field of Classification Search
USPC ................ 327/175; 363/21.1, 21.11
See application file for complete search history.

(56) References Cited

U.S. PATENT DOCUMENTS

| | | | |
|---|---|---|---|
| 6,658,583 B1 | 12/2003 | Kudo et al. | 713/500 |
| 8,279,645 B2 * | 10/2012 | Bridge et al. | 363/65 |
| 2007/0230559 A1 | 10/2007 | Kris et al. | 375/238 |
| 2009/0002043 A1 | 1/2009 | Kris | 327/175 |

OTHER PUBLICATIONS

International Search Report and Written Opinion, Application No. PCT/US2012/055895, 8 pages.

* cited by examiner

*Primary Examiner* — Arnold Kinkead
(74) *Attorney, Agent, or Firm* — King & Spalding L.L.P.

(57) ABSTRACT

Extending pulse width modulation phase offset when generating phase shifted groups of pulse width modulation (PWM) signals is accomplished with a separate phase counter that is independent of the time-base counters used in traditional PWM generation circuits and that is prevented from being retriggered until an existing duty cycle has completed. This is accomplished with a phase offset counter, a phase comparator and a circuit that is triggered via a master time base for overall synchronization of the multi-phase PWM signal generation.

5 Claims, 4 Drawing Sheets

EXTENDING PULSE WIDTH MODULATION PHASE OFFSET

TECHNICAL FIELD

The present disclosure relates generally to generation of groups of pulse width modulation signals, and more particularly to extending pulse width modulation phase offsets of the groups of pulse width modulation signals.

BACKGROUND

Power conversion applications are becoming increasingly more sophisticated to improve their power conversion efficiencies, for example, by using arrays (groups) of pulse width modulation (PWM) signal outputs that are phase shifted relative to each other. Presently newer PWM controlled designs are using multiple sets of these PWM signals that are phase shifted relative to each other for controlling a plurality of power transistors having outputs combined into a single very low ripple direct current power source switch mode power supply (SMPS). This requires phase shifting greater than 360 electrical degrees (greater than one PWM period). Present technology PWM generation circuits cannot support this functionality.

Phase shifted groups of PWM signals are often used in state of the art resonant switch mode power conversion circuits to improve power conversion efficiency thereof. Present technology PWM generation circuits either use PWM counter "preloads" or add/subtract circuits to create phase shifts between the group PWM signals. However, both types of these circuits have problems with phase "wrap-around." Heretofore, complex software has been used to perform the phase "wrap-around so as to simulate the behavior of large PWM phase offsets (greater than 360 electrical degrees). Using software for this purpose is difficult to do properly at the high frequency pulse rates required for these switch mode power supply (SMPS) applications. In addition, proper control becomes impossible when trying to respond to asynchronous events.

SUMMARY

Therefore, what is needed is a way to maintain phase shifts greater than 360 electrical degrees between groups of PWM signals. According to the teachings of this disclosure, a separate phase counter is used that is independent of the time-base counters used in traditional PWM generation circuits and that is prevented from being retriggered until the existing duty cycle has completed. This is accomplished with a phase offset counter, a phase comparator and a circuit that is triggered via a master time base for overall circuit synchronization.

According to a specific example embodiment of this disclosure, a pulse width modulation (PWM) generator (401) for generating a PWM signal having extended phase offset comprises: a duty cycle register (108) storing a duty cycle value; a duty cycle counter (402) having a clock input coupled to a clock generating a plurality of clock pulses, and incrementing a duty cycle count value for each of the plurality of clock pulses received; a duty cycle comparator (110) coupled to the duty cycle register (108) and the duty cycle counter (402), compares the duty cycle count value to the duty cycle value, and generates a phase offset related PWM signal when the duty cycle count value is less than or equal to the duty cycle value; a local period comparator (424) coupled to the duty cycle counter (402) and a master period register (504), compares the duty cycle count value to a master period value from the master period register (504), and generates a logic high when the duty cycle value is equal to or greater than the master period value; a phase counter (426) having a clock input coupled to the clock and incrementing a phase count value for each of the plurality of clock pulses received; a phase offset register (412) storing a phase offset value; a phase offset comparator (428) coupled to the phase counter (426) and the phase offset register (412), compares the phase count value to the phase offset value, and generates a logic high when the phase count value is equal to or greater than the phase offset value; the phase offset comparator (428) has an output coupled to a stop input of the phase counter (426) and when the output thereof is at a logic high the phase counter (426) is prevented from incrementing the phase count value for each of the plurality of clock pulses received; a cycle-in-process (CIP) flip-flop (432) having a clock input coupled to a PWM cycle start signal, a D-input coupled to a logic high and a reset input coupled to an inverted output of the duty cycle comparator (110); an edge detector circuit (434, 436) having a first input coupled to the clock, and a second input coupled to an output of the phase offset comparator (428); a first AND gate (430) having a first input coupled to the PWM cycle start signal and a second input coupled to an inverted output of the CIP flip-flop 432; and an OR gate (422) having a first input coupled to an output of the edge detector circuit (434, 436), a second input coupled to an output of the local period comparator (424), and an output coupled to a reset input of the duty cycle counter (402), wherein the PWM cycle start signal is generated each time a period roll-over event occurs, wherein if the inverted output of the CIP flip-flop (432) is a logic high at the second input of the first AND gate (430) and the PWM cycle start signal is a logic high at the first input of the first AND gate (430) then the phase count value is reset to zero and the inverted output of the CIP flip-flop (432) is set to a logic low, whereby all further ones of the PWM cycle start signal are ignored until the inverted output of the CIP flip-flop (432) is reset back to a logic high, wherein the phase counter (426) stops counting when the phase count value is equal to or greater than the phase offset value in the phase offset register (412), and wherein if the duty cycle count value is greater than the duty cycle value then the CIP flip-flop (432) is reset so that the output thereof is at a logic high, the duty cycle count value in the duty cycle counter (402) is reset to zero, and then a new duty cycle count starts.

According to another specific example embodiment of this disclosure, a system for generating a plurality of pulse width modulation (PWM) signals having extended phase offsets comprises: a master time base generator (500), wherein the master time base generator (500) comprises: a master period counter (502) having a clock input coupled to a clock generating a plurality of clock pulses, and incrementing a master count value for each of the plurality of clock pulses received; a master period register (504) having a master period value; a master period comparator (506) coupled to the master period register (504) and the master period counter (502), compares the master count value to the master period value, generates a PWM cycle start signal when the master count value is equal to or greater than the master period value, and then resets the master count value in the master period counter (502) to zero; and a plurality of pulse width modulation (PWM) generators (401) for generating a plurality of PWM signals having extended phase offsets, each of said plurality of PWM generators (401) comprises: a duty cycle register (108) storing a duty cycle value; a duty cycle counter (402) having a clock input coupled to the clock, and incrementing a duty cycle count value for each of the plurality of clock pulses received; a duty cycle comparator (110) coupled to the duty cycle register (108) and the duty cycle counter (402), compares the duty cycle count value to the duty cycle value, and generates a phase offset related PWM signal when the duty cycle count value is less than or equal to the duty cycle value; a local period comparator (424) coupled to the duty cycle counter (402) and the master period register (504), compares the duty cycle count value to the master period value from the master period register (504), and generates a logic high when the duty cycle value is equal to or greater than the master period value; a phase counter (426) having a clock input coupled to the clock and incrementing a phase count value for each of the plurality of clock pulses received; a phase offset register (412) storing a phase offset value; a phase offset comparator (428) coupled to the phase counter (426) and the phase offset register (412), compares the phase count value to the phase offset value, and generates a logic high when the phase count value is equal to or greater than the phase offset value; the phase offset comparator (428) has an output coupled to a stop input of the phase counter (426) and when the output thereof is at a logic high the phase counter (426) is prevented from incrementing the phase count value for each of the plurality of clock pulses received; a cycle-in-process (CIP) flip-flop (432) having a clock input coupled to a PWM cycle start signal, a D-input coupled to a logic high and a reset input coupled to an inverted output of the duty cycle comparator (110); an edge detector circuit (434, 436) having a first input coupled to the clock, and a second input coupled to an output of the phase offset comparator (428); a first AND gate (430) having a first input coupled to the PWM cycle start signal and a second input coupled to an inverted output of the CIP flip-flop 432; and an OR gate (422) having a first input coupled to an output of the edge detector circuit (434, 436), a second input coupled to an output of the local period comparator (424), and an output coupled to a reset input of the duty cycle counter (402), wherein the master time base generator (500) generates the PWM cycle start signal each time a period roll-over event occurs, wherein if the inverted output of the CIP flip-flop (432) is a logic high at the second input of the first AND gate (430) and the PWM cycle start signal is a logic high at the first input of the first AND gate (430) then the phase count value is reset to zero and the inverted output of the CIP flip-flop (432) is set to a logic low, whereby all further ones of the PWM cycle start signal are ignored until the inverted output of the CIP flip-flop (432) is reset back to a logic high, wherein the phase counter (426) stops counting when the phase count value is equal to or greater than the phase offset value in the phase offset register (412), and wherein if the duty cycle count value is greater than the duty cycle value then the CIP flip-flop (432) is reset so that the output thereof is at a logic high, the duty cycle count value in the duty cycle counter (402) is reset to zero, and then a new duty cycle count starts.

According to yet another specific example embodiment of this disclosure, a method for generating a plurality of pulse width modulation (PWM) signals having extended phase offsets comprises the steps of: providing a master count value from a master period counter (502), wherein the master count value is incremented for each one of a plurality of clock pulses received by the master period counter (502); providing a master period value in a master period register (504); comparing the master count value to the master period value with a master period comparator (506); generating a PWM cycle start signal when the master count value is equal to or greater than the master period value, and then resetting the master count value in the master period counter (502) to zero; generating a plurality of phase offset related PWM signals with a plurality of pulse width modulation (PWM) generators (401), wherein generating each of the plurality of phase offset related PWM signals comprises the steps of: storing a duty cycle value in a duty cycle register (108); incrementing a duty cycle count value with a duty cycle counter (402) for each one of the plurality of clock pulses received by the duty cycle counter (402); comparing the duty cycle count value to the duty cycle value with a duty cycle comparator (110); generating the one of the plurality of phase offset related PWM signals when the compared duty cycle count value is less than or equal to the duty cycle value; comparing the duty cycle count value to the master period value with a local period comparator (424); generating a logic high with the local period comparator (424) when the duty cycle value is equal to or greater than the master period value; incrementing a phase count value in a phase counter (426) for each of the plurality of clock pulses received by the phase counter (426); storing a phase offset value in a phase offset register (412); comparing the phase count value to the phase offset value with a phase offset comparator (428); generating a logic high from the phase offset comparator (428) when the phase count value is equal to or greater than the phase offset value; preventing incrementing the phase count value for each of the plurality of clock pulses received when an output from the phase offset comparator (428) is at a logic high; generating the PWM cycle start signal each time a period roll-over event occurs; suspending counting in the phase counter (426) when the phase count value is equal to or greater than the phase offset value; resetting the duty cycle count value in the duty cycle counter (402) to zero; and then starting a new duty cycle count.

BRIEF DESCRIPTION OF THE DRAWINGS

A more complete understanding of the present disclosure thereof may be acquired by referring to the following description taken in conjunction with the accompanying drawings wherein.

Figure 1:
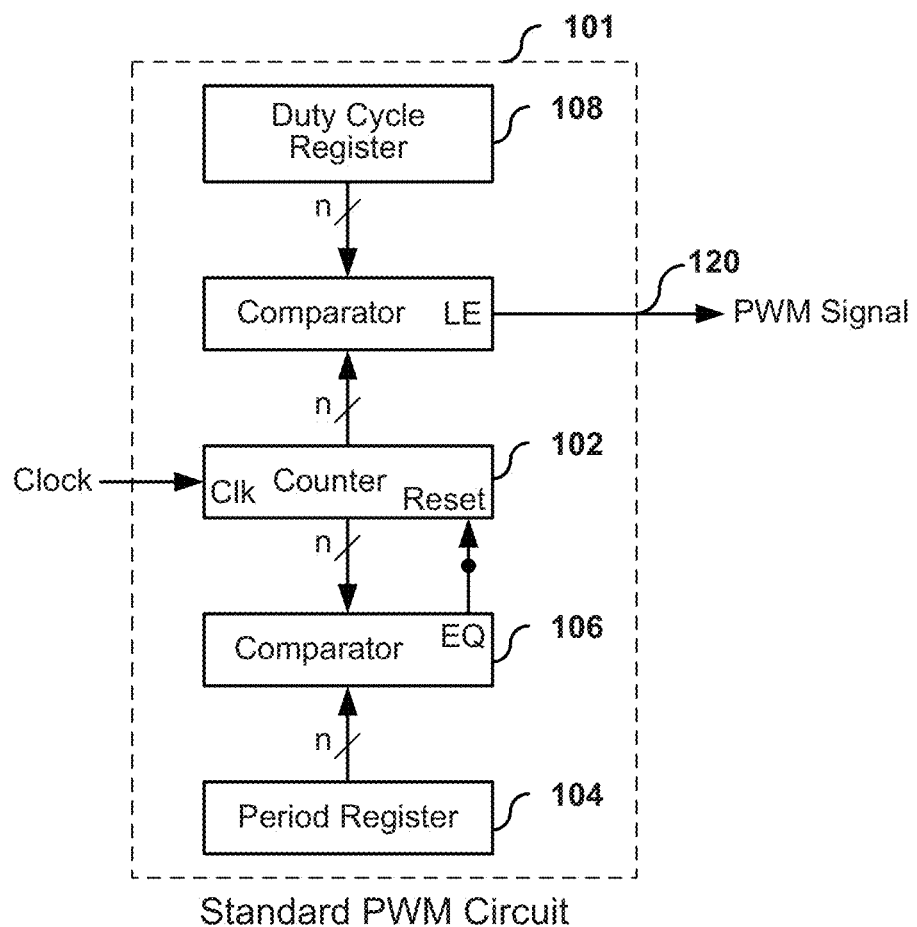
FIG. 1 illustrates a typical pulse width modulation (PWM) generator circuit.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of an example embodiment is schematically illustrated. Like elements in the drawings will be represented by like numbers, and similar elements will be represented by like numbers with a different lower case letter suffix.

Referring to FIG. 1, depicted is a typical pulse width modulation (PWM) generator circuit. The PWM generator circuit 101 comprises a timer/counter 102, a period register 104, a comparator 106 and a duty cycle register 108. The timer/counter 102 counts up from zero until it reaches a value specified by the period register 104 as determined by the comparator 106. The period register 104 contains a user specified value which represents the maximum counter value that determines the PWM period. When the timer/counter 102 matches the value in the period register 104, the timer/counter 102 is cleared by a reset signal from the comparator 106, and the cycle repeats. The duty cycle register 108 stores the user specified duty cycle value. A PWM output signal 120 is asserted (driven high) whenever the timer/counter 102 value is less than the duty cycle value stored in the duty cycle register 108. The PWM output signal 120 is de-asserted (driven low) when the timer/counter value 102 is greater than or equal to the duty cycle value stored in the duty cycle register 108.

Figure 2:
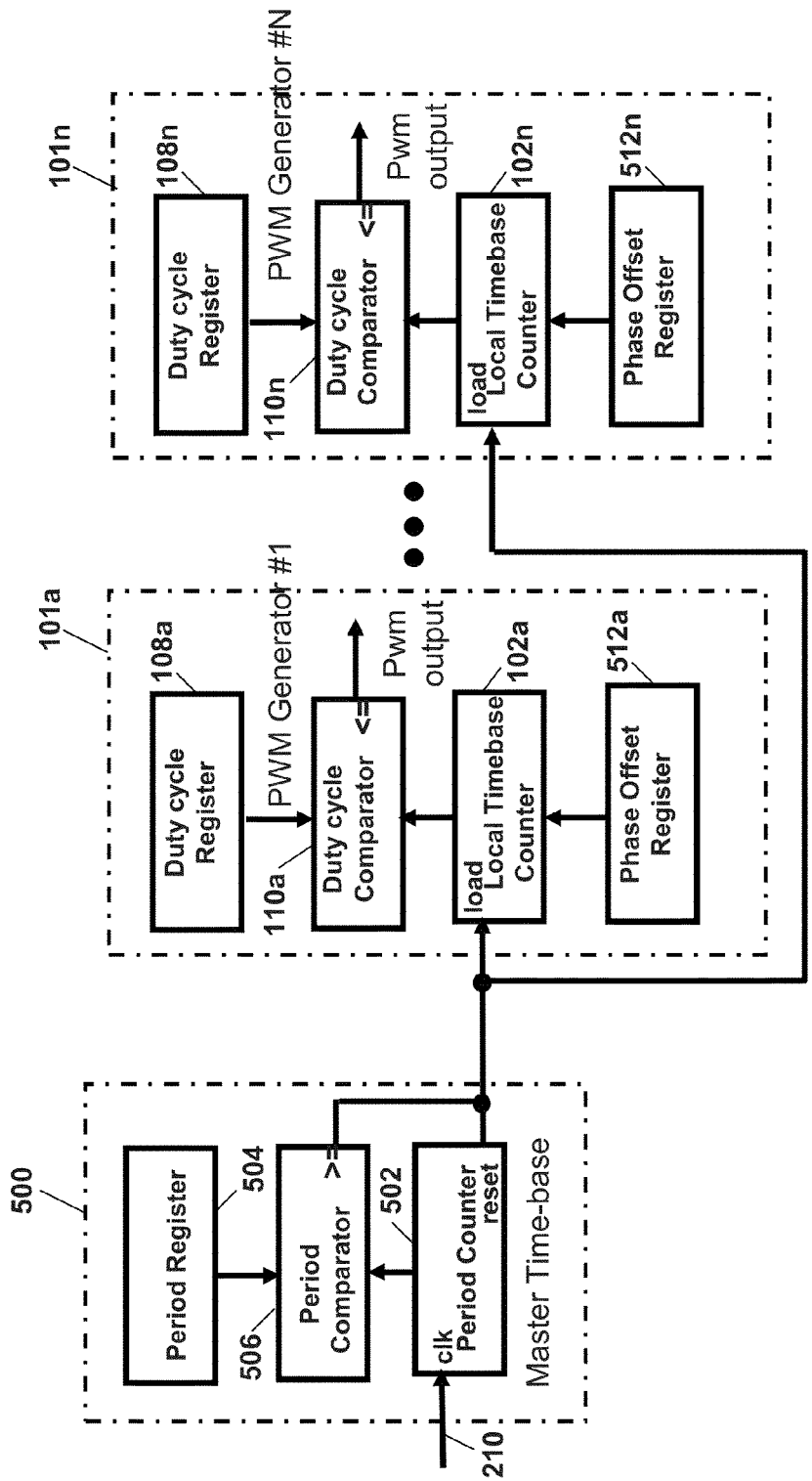
FIG. 2 illustrates a schematic block diagram of a PWM circuit for generating groups of PWM signals having phase offsets between each of the PWM signals.

Referring to FIG. 2, depicted is a schematic block diagram of a PWM circuit for generating groups of PWM signals having phase offsets between each of the PWM signals. The multiphase PWM generation circuit comprises a master time base 500 and a plurality of PWM generators 101. The master time base 500 comprising a period register 504, period comparator 506 and a period counter 502 that control the period of each of the PWM signal phases of the PWM generators 101a-101n. Each of the PWM generators 101 comprises a phase offset register 512 used to determine the phase offset of the respective PWM output signal from each of the PWM generators 101. The PWM period register 504, duty cycle register 108 and phase-offset register 512 are programmed to values required to obtain a desired operating frequency (period), duty cycle and phase-offset, respectively. The local time base counters 102 are synchronized to the master time base 500. The individual PWM signal outputs may differ in phase (determined by the phase offset register 512) but not in frequency (period).

Figure 3:
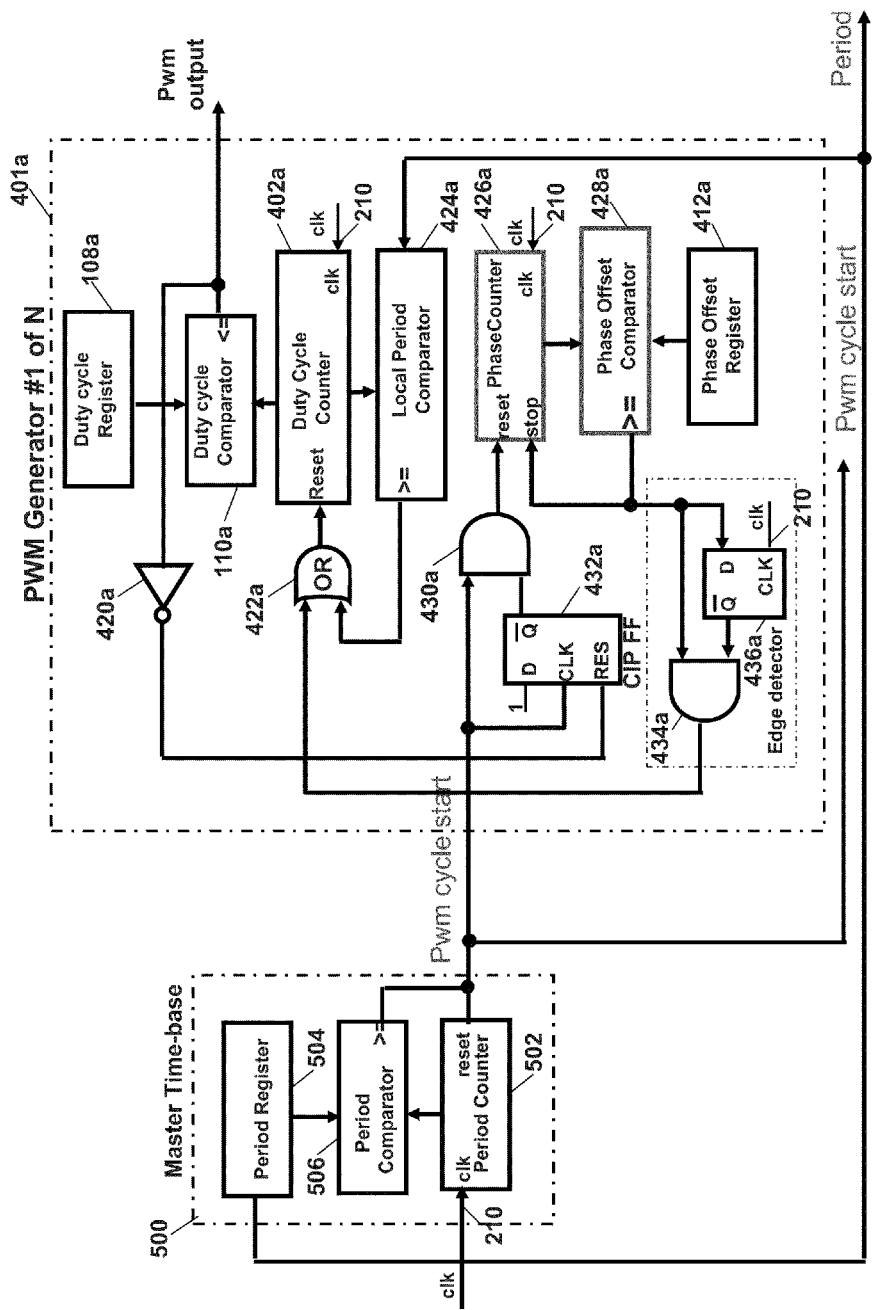
FIG. 3 illustrates a schematic block diagram of a PWM signal generation circuit having the capability of extended phase offsets when generating a group of PWM signals, according to a specific example embodiment of this disclosure.
Figure 4:
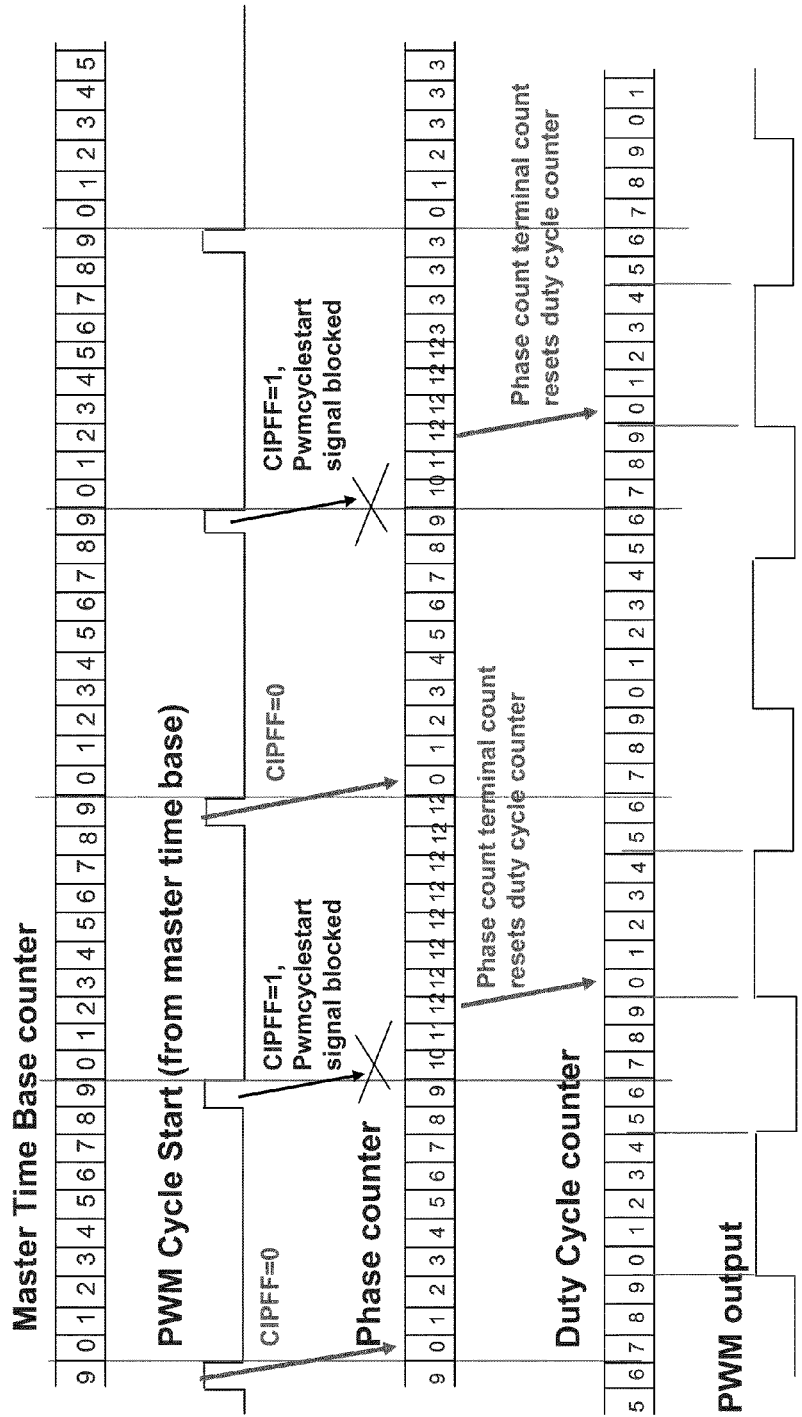
FIG. 4 illustrates a schematic timing diagram of a single PWM signal from the PWM generation circuit shown in FIG. 3.

Referring to FIGS. 3 and 4, depicted are a schematic block diagram of a PWM signal generation circuit having the capability of extended phase offsets when generating a group of PWM signals, and a schematic timing diagram (FIG. 4) of a single PWM signal from the PWM generation circuit shown in FIG. 3, according to a specific example embodiment of this disclosure. A master time-base generation circuit 500 comprises a master time-base period counter 502, a master time-base period register 504, and a master time-base period comparator 506.

The master time-base generation circuit 500 generates a PWM cycle start signal at logic "1" each time the master time-base period counter 502 reaches its terminal count and rolls over to zero. The PWM cycle start signal is coupled to each of the PWM generators 401. If the cycle-in-process (CIP) flip-flop 432 is reset (Q\-output at a logic "1") and a PWM cycle start signal is received at the clock ("CLK") input, then the phase counter 426 is reset and the associated CIP flip-flop 432 is set (Q\-output at a logic "0"). Wherein during the time that the CIP flip-flop 432 is set and a PWM cycle start signal is received, nothing further happens (AND gate 430 blocks a reset signal to the phase counter 426). The terms "local time base counter" and "duty cycle counter" 402 will be used interchangeable herein.

If the value in the phase counter 426 is less than the value in the phase offset register 412, then the phase counter 426 continues to count up. When the value in the phase counter 426 is greater than or equal to the value in the phase offset register 412, the phase counter 426 stops counting and the associated local time base counter (duty cycle counter) 402 is reset when the phase counter 426 reaches its terminal count, e.g., via the edge detect circuit comprising flip-flop 436 and AND gate 434. When the value of the local time base counter (duty cycle counter) 402 is greater than or equal to the value in the duty cycle register 108, the CIP flip-flop 432 is reset (cleared) (Q\-output at a logic "1") and is ready (armed) to accept the next received PWM cycle start signal and then starts at the beginning of the above described process again. However, the local time base counter (duty cycle counter) 402 may continue to rollover and start new PWM cycles.

The schematic timing diagram shown in FIG. 4, is, for exemplary purposes, of a single PWM signal having a period=9, a duty cycle=4, and a phase offset=12. Whenever the CIP flip-flop 432 is reset) (Q\-output at a logic "0") the PWM cycle start signal is allowed to pass to and reset the phase counter 426, but if the CIP flip-flop 432 is set) (Q\-output at a logic "1") the PWM cycle start signal is blocked from passing to and resetting the phase counter 426.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A pulse width modulation (PWM) generator (401) for generating a PWM signal having extended phase offset, comprising:
   a duty cycle register (108) storing a duty cycle value;
   a duty cycle counter (402) having a clock input coupled to a clock generating a plurality of clock pulses, and incrementing a duty cycle count value for each of the plurality of clock pulses received;
   a duty cycle comparator (110) coupled to the duty cycle register (108) and the duty cycle counter (402), compares the duty cycle count value to the duty cycle value, and generates a phase offset related PWM signal when the duty cycle count value is less than or equal to the duty cycle value;
   a local period comparator (424) coupled to the duty cycle counter (402) and a master period register (504), compares the duty cycle count value to a master period value from the master period register (504), and generates a logic high when the duty cycle value is equal to or greater than the master period value;
   a phase counter (426) having a clock input coupled to the clock and incrementing a phase count value for each of the plurality of clock pulses received;
   a phase offset register (412) storing a phase offset value;
   a phase offset comparator (428) coupled to the phase counter (426) and the phase offset register (412), compares the phase count value to the phase offset value, and generates a logic high when the phase count value is equal to or greater than the phase offset value;
   the phase offset comparator (428) has an output coupled to a stop input of the phase counter (426) and when the output thereof is at a logic high the phase counter (426) is prevented from incrementing the phase count value for each of the plurality of clock pulses received;
   a cycle-in-process (CIP) flip-flop (432) having a clock input coupled to a PWM cycle start signal, a D-input coupled to a logic high and a reset input coupled to an inverted output of the duty cycle comparator (110);
an edge detector circuit (434, 436) having a first input coupled to the clock, and a second input coupled to an output of the phase offset comparator (428);
a first AND gate (430) having a first input coupled to the PWM cycle start signal and a second input coupled to an inverted output of the CIP flip-flop 432; and
an OR gate (422) having a first input coupled to an output of the edge detector circuit (434, 436), a second input coupled to an output of the local period comparator (424), and an output coupled to a reset input of the duty cycle counter (402),
 wherein the PWM cycle start signal is generated each time a period roll-over event occurs,
 wherein if the inverted output of the CIP flip-flop (432) is a logic high at the second input of the first AND gate (430) and the PWM cycle start signal is a logic high at the first input of the first AND gate (430) then the phase count value is reset to zero and the inverted output of the CIP flip-flop (432) is set to a logic low, whereby all further ones of the PWM cycle start signal are ignored until the inverted output of the CIP flip-flop (432) is reset back to a logic high,
 wherein the phase counter (426) stops counting when the phase count value is equal to or greater than the phase offset value in the phase offset register (412), and
 wherein if the duty cycle count value is greater than the duty cycle value then the CIP flip-flop (432) is reset so that the output thereof is at a logic high, the duty cycle count value in the duty cycle counter (402) is reset to zero, and then a new duty cycle count starts.

2. The PWM generator according to claim 1, wherein the edge detector circuit (434, 436) comprises:
 a D flip-flop (436) having a clock input coupled to the clock and a D-input coupled to an output of the phase offset comparator (428); and
 a second AND gate (434) having a first input coupled to the output of the phase offset comparator (428), a second input coupled to an inverted output of the D flip-flop (436), and an output coupled to the first input of the OR gate (422).

3. A system for generating a plurality of pulse width modulation (PWM) signals having extended phase offsets, said system comprising:
 a master time base generator (500), wherein the master time base generator (500) comprises:
  a master period counter (502) having a clock input coupled to a clock generating a plurality of clock pulses, and incrementing a master count value for each of the plurality of clock pulses received;
  a master period register (504) having a master period value;
  a master period comparator (506) coupled to the master period register (504) and the master period counter (502), compares the master count value to the master period value, generates a PWM cycle start signal when the master count value is equal to or greater than the master period value, and then resets the master count value in the master period counter (502) to zero; and
 a plurality of pulse width modulation (PWM) generators (401) for generating a plurality of PWM signals having extended phase offsets, each of said plurality of PWM generators (401) comprises:
  a duty cycle register (108) storing a duty cycle value;
  a duty cycle counter (402) having a clock input coupled to the clock, and incrementing a duty cycle count value for each of the plurality of clock pulses received;
  a duty cycle comparator (110) coupled to the duty cycle register (108) and the duty cycle counter (402), compares the duty cycle count value to the duty cycle value, and generates a phase offset related PWM signal when the duty cycle count value is less than or equal to the duty cycle value;
  a local period comparator (424) coupled to the duty cycle counter (402) and the master period register (504), compares the duty cycle count value to the master period value from the master period register (504), and generates a logic high when the duty cycle value is equal to or greater than the master period value;
  a phase counter (426) having a clock input coupled to the clock and incrementing a phase count value for each of the plurality of clock pulses received;
  a phase offset register (412) storing a phase offset value;
  a phase offset comparator (428) coupled to the phase counter (426) and the phase offset register (412), compares the phase count value to the phase offset value, and generates a logic high when the phase count value is equal to or greater than the phase offset value;
  the phase offset comparator (428) has an output coupled to a stop input of the phase counter (426) and when the output thereof is at a logic high the phase counter (426) is prevented from incrementing the phase count value for each of the plurality of clock pulses received;
  a cycle-in-process (CIP) flip-flop (432) having a clock input coupled to a PWM cycle start signal, a D-input coupled to a logic high and a reset input coupled to an inverted output of the duty cycle comparator (110);
  an edge detector circuit (434, 436) having a first input coupled to the clock, and a second input coupled to an output of the phase offset comparator (428);
  a first AND gate (430) having a first input coupled to the PWM cycle start signal and a second input coupled to an inverted output of the CIP flip-flop 432; and
  an OR gate (422) having a first input coupled to an output of the edge detector circuit (434, 436), a second input coupled to an output of the local period comparator (424), and an output coupled to a reset input of the duty cycle counter (402),
   wherein the master time base generator (500) generates the PWM cycle start signal each time a period roll-over event occurs,
   wherein if the inverted output of the CIP flip-flop (432) is a logic high at the second input of the first AND gate (430) and the PWM cycle start signal is a logic high at the first input of the first AND gate (430) then the phase count value is reset to zero and the inverted output of the CIP flip-flop (432) is set to a logic low, whereby all further ones of the PWM cycle start signal are ignored until the inverted output of the CIP flip-flop (432) is reset back to a logic high,
   wherein the phase counter (426) stops counting when the phase count value is equal to or greater than the phase offset value in the phase offset register (412), and
   wherein if the duty cycle count value is greater than the duty cycle value then the CIP flip-flop (432) is reset so that the output thereof is at a logic high, the duty cycle count value in the duty cycle counter (402) is reset to zero, and then a new duty cycle count starts.

4. The system according to claim 3, wherein the edge detector circuit (434, 436) comprises:
a D flip-flop (436) having a clock input coupled to the clock and a D-input coupled to an output of the phase offset comparator (428); and
a second AND gate (434) having a first input coupled to the output of the phase offset comparator (428), a second input coupled to an inverted output of the D flip-flop (436), and an output coupled to the first input of the OR gate (422).

5. A method for generating a plurality of pulse width modulation (PWM) signals having extended phase offsets, said method comprising the steps of:
providing a master count value from a master period counter (502), wherein the master count value is incremented for each one of a plurality of clock pulses received by the master period counter (502);
providing a master period value in a master period register (504);
comparing the master count value to the master period value with a master period comparator (506);
generating a PWM cycle start signal when the master count value is equal to or greater than the master period value, and then resetting the master count value in the master period counter (502) to zero;
generating a plurality of phase offset related PWM signals with a plurality of pulse width modulation (PWM) generators (401), wherein generating each of the plurality of phase offset related PWM signals comprises the steps of:
storing a duty cycle value in a duty cycle register (108);
incrementing a duty cycle count value with a duty cycle counter (402) for each one of the plurality of clock pulses received by the duty cycle counter (402);
comparing the duty cycle count value to the duty cycle value with a duty cycle comparator (110);
generating the one of the plurality of phase offset related PWM signals when the compared duty cycle count value is less than or equal to the duty cycle value;
comparing the duty cycle count value to the master period value with a local period comparator (424);
generating a logic high with the local period comparator (424) when the duty cycle value is equal to or greater than the master period value;
incrementing a phase count value in a phase counter (426) for each of the plurality of clock pulses received by the phase counter (426);
storing a phase offset value in a phase offset register (412);
comparing the phase count value to the phase offset value with a phase offset comparator (428);
generating a logic high from the phase offset comparator (428) when the phase count value is equal to or greater than the phase offset value;
preventing incrementing the phase count value for each of the plurality of clock pulses received when an output from the phase offset comparator (428) is at a logic high;
generating the PWM cycle start signal each time a period roll-over event occurs;
suspending counting in the phase counter (426) when the phase count value is equal to or greater than the phase offset value;
resetting the duty cycle count value in the duty cycle counter (402) to zero; and then
starting a new duty cycle count.

* * * * *